(12) United States Patent
Liu et al.

(10) Patent No.: US 12,269,201 B2
(45) Date of Patent: Apr. 8, 2025

(54) FOLDING DEVICE AND FOLDING METHOD

(71) Applicant: BOE TECHNOLOGY GROUP CO., LTD., Beijing (CN)

(72) Inventors: Shuqi Liu, Beijing (CN); Wenyue Fu, Beijing (CN); Xinhong Lu, Beijing (CN); Qi Qi, Beijing (CN); Xiaojie Pan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 495 days.

(21) Appl. No.: 17/761,039

(22) PCT Filed: May 18, 2021

(86) PCT No.: PCT/CN2021/094319
§ 371 (c)(1),
(2) Date: Mar. 16, 2022

(87) PCT Pub. No.: WO2021/244275
PCT Pub. Date: Dec. 9, 2021

(65) Prior Publication Data
US 2022/0339855 A1 Oct. 27, 2022

(30) Foreign Application Priority Data

Jun. 4, 2020 (CN) .......................... 202021010834.8

(51) Int. Cl.
*B65H 45/12* (2006.01)
*B29C 53/04* (2006.01)
(Continued)

(52) U.S. Cl.
CPC .............. *B29C 53/80* (2013.01); *B29C 53/04* (2013.01); *B29C 65/48* (2013.01); *B29C 66/431* (2013.01);
(Continued)

(58) Field of Classification Search
CPC ......... B29C 53/04; B29C 53/80; B29C 65/48; B29C 65/431; H01L 25/167;
(Continued)

(56) References Cited

U.S. PATENT DOCUMENTS 6,601,874 B1 * 8/2003 Amitrano ................ B42C 17/00
412/8
7,618,033 B2 * 11/2009 Fujita .................. G03G 15/6582
270/32
(Continued)

FOREIGN PATENT DOCUMENTS

CN 202207737 A 5/2012
CN 304045231 S 2/2017
(Continued)

*Primary Examiner* — Leslie A Nicholson, III
(74) *Attorney, Agent, or Firm* — HOUTTEMAN LAW LLC

(57) ABSTRACT

A folding device and a folding method are provided. The folding device includes a bearing and fixing mechanism configured to bear and fix a main body portion of a to-be-folded device; a folding mechanism disposed on at least one lateral side of the bearing and fixing mechanism, the folding mechanism being configured to bear a to-be-folded portion of the to-be-folded device and fold the to-be-folded portion to one side in a thickness direction of the main body portion; a first driving mechanism configured to drive the folding mechanism to move along a direction perpendicular to a bearing surface, which bears the main body portion, of the bearing and fixing mechanism; and a second driving mechanism configured to drive the folding mechanism to move close to or away from the bearing and fixing mechanism along a direction parallel to the bearing surface.

16 Claims, 9 Drawing Sheets

(51) Int. Cl.
  *B29C 53/80* (2006.01)
  *B29C 65/00* (2006.01)
  *B29C 65/48* (2006.01)
  *H01L 25/16* (2023.01)
  *B29K 79/00* (2006.01)
  *B29L 31/34* (2006.01)

(52) U.S. Cl.
  CPC ........ *H01L 25/167* (2013.01); *B29K 2079/08* (2013.01); *B29L 2031/3475* (2013.01); *B65H 45/12* (2013.01)

(58) Field of Classification Search
  CPC ......... B29K 2079/08; B29L 2031/3475; B05C 5/02; B05C 9/12; B65H 45/12
  USPC .......................................................... 270/41
  See application file for complete search history.

(56) References Cited

U.S. PATENT DOCUMENTS

| | | | | |
|---|---|---|---|---|
| 7,823,867 | B2* | 11/2010 | Sato | G03G 15/6544 |
| | | | | 270/58.11 |
| 11,926,499 | B2* | 3/2024 | Liu | B65H 45/16 |
| 2011/0062645 | A1 | 3/2011 | Yokochi | |
| 2017/0173656 | A1 | 6/2017 | Bauer | |

FOREIGN PATENT DOCUMENTS

| | | |
|---|---|---|
| CN | 106488814 A | 3/2017 |
| CN | 107705709 A | 2/2018 |
| CN | 108198513 A | 6/2018 |
| CN | 109272874 A | 1/2019 |
| CN | 212503294 U | 2/2021 |

* cited by examiner

FOLDING DEVICE AND FOLDING METHOD

CROSS REFERENCE TO RELATED APPLICATION

This application claims priority of the Chinese patent application No. 202021010834.8 filed on Jun. 4, 2020, which is hereby incorporated by reference in its entirety.

TECHNICAL FIELD

The present disclosure relates to the technical field of mechanical manufacturing, in particular to display screen manufacturing, and particularly relates to a folding device and a folding method.

BACKGROUND

In the manufacturing process of a display screen, driving circuits on at least one side of the display screen needs to be folded to the backlight side of the display screen. However, folding by manual work involves great difficulty, which could easily lead to damages to the connection wiring between the display area and the driving circuit.

SUMMARY

The present disclosure provides a folding device and a corresponding folding method, seeking to solve at least one of the technical problems in the existing technology.

In one aspect, the present disclosure provides a folding device including: a bearing and fixing mechanism configured to bear and fix a main body portion of a to-be-folded device: a folding mechanism disposed on at least one lateral side of the bearing and fixing mechanism, the folding mechanism being configured to bear a to-be-folded portion of the to-be-folded device and fold the to-be-folded portion to one side in a thickness direction of the main body portion: a first driving mechanism connected to the folding mechanism and configured to drive the folding mechanism to move along a direction perpendicular to a bearing surface, which bears the main body portion, of the bearing and fixing mechanism; and a second driving mechanism connected to the folding mechanism and configured to drive the folding mechanism to move close to or away from the bearing and fixing mechanism along a direction parallel to the bearing surface.

In one embodiment, the folding mechanism includes: a first bearing stage; and a first rotating shaft disposed on a side of the first bearing stage facing toward the bearing and fixing mechanism, the first rotating shaft including a rotating shaft body and a flexible layer disposed around the rotating shaft body, the rotating shaft body being rotatably connected to the first bearing stage.

In one embodiment, the first bearing stage has a thickness less than a diameter of the first rotating shaft.

In one embodiment, the folding device further includes: a base on which the bearing and fixing mechanism is disposed: a first guide rail disposed on the base and extending in a first direction: a mounting seat disposed on the first guide rail and movable along the first guide rail: wherein, the folding mechanism is disposed on the mounting seat.

In one embodiment, the first driving mechanism includes: a guide shaft having one end fixedly disposed on the mounting seat and the other end passing through the first bearing stage; and a screw motor, a screw of the screw motor passing through the first bearing stage, the screw motor being configured to drive the screw of the screw motor to rotate so as to drive the first bearing stage to ascend and descend along the guide shaft.

In one embodiment, the folding device further includes: a sliding portion disposed on the first guide rail and movable along the first guide rail: a beam connected to the sliding portion and positioned on a side of the bearing and fixing mechanism away from the base; and a buffer layer disposed on a surface of the beam away from the base.

In one embodiment, the bearing and fixing mechanism includes a fixing member disposed on at least one lateral side of the bearing and fixing mechanism, the fixing member having a fixed state and an unfixed state, wherein a portion of the fixing member in the fixed state is pressed against the main body portion, and an orthographic projection of the fixing member in the unfixed state on a plane where the bearing surface is positioned is located outside the bearing surface: wherein the fixing member and the folding mechanism are located on different sides of the bearing and fixing mechanism.

In one embodiment, the fixing member includes: a second rotating shaft disposed on the base: a fixing part rotatably connected to the base through the second rotating shaft: a pressing part disposed on the fixing part, wherein the pressing part has a pressing surface facing toward the to-be-folded device, the pressing part is movable close to or away from the base, and the pressing surface is configured to press against the main body portion on the bearing and fixing mechanism when the fixing member is in the fixed state.

In one embodiment, the bearing and fixing mechanism further includes: a first driving member connected to the fixing member and configured to drive the fixing member to switch between the fixed state and the unfixed state.

In one embodiment, the folding device further includes: a gluing mechanism configured to apply glue to the to-be-folded device; and a curing mechanism configured to cure the glue on the to-be-folded device.

In one embodiment, the gluing mechanism includes: a second guide rail extending in a first direction: a stand disposed on the second guide rail and movable along the second guide rail: a third guide rail disposed on the stand and extending in a second direction, the second direction intersecting the first direction; and an gluing head disposed on the third guide rail and configured to output the glue, the gluing head being movable along the third guide rail.

In one embodiment, the gluing mechanism further includes: a second driving member connected to the stand and configured to drive the stand to move along the second guide rail; and a third driving member connected to the gluing head and configured to drive the gluing head to move along the third guide rail.

In one embodiment, the curing mechanism includes a curing lamp disposed on a side of the folding mechanism opposite a side bearing the to-be-folded portion.

In one embodiment, the folding device further includes a controller configured to control the first driving mechanism and the second driving mechanism: wherein the controller is configured to first drive the first driving mechanism to ascend in a direction perpendicular to the bearing surface and then drive the second driving mechanism to move in a direction approaching the bearing and fixing mechanism, during a folding operation of the folding mechanism.

In another aspect, the present disclosure provides a folding method implemented by a folding device to a to-be-folded device, wherein the folding device includes a bearing and fixing mechanism, a folding mechanism, a first driving mechanism and a second driving mechanism, the folding mechanism being disposed on at least one lateral side of the bearing and fixing mechanism. The folding method includes operations of: placing and fixing the main body portion of the to-be-folded device on a bearing surface of the bearing and fixing mechanism, and placing the to-be-folded portion of the to-be-folded device on the folding mechanism: driving, by the first driving mechanism, the folding mechanism to ascend along a direction perpendicular to the bearing surface; and driving, by the second driving mechanism, the folding mechanism to move close to the bearing and fixing mechanism along a direction parallel to the bearing surface, so as to fold the to-be-folded portion to one side in a thickness direction of the main body portion.

In one embodiment, the folding mechanism includes: a first bearing stage; and a first rotating shaft disposed on a side of the first bearing stage facing toward the bearing and fixing mechanism, the first rotating shaft including a rotating shaft body and a flexible layer disposed around the rotating shaft body, the rotating shaft body being rotatably connected to the first bearing stage, wherein, in the operation of driving, by the first driving mechanism, the folding mechanism to ascend, the flexible layer is deformed due to pressing the lateral side of the bearing and fixing mechanism, and wherein, in the operation of driving, by the second driving mechanism, the folding mechanism to move close to the bearing and fixing mechanism, the flexible layer presses the to-be-folded portion toward the main body portion.

In one embodiment, prior to driving, by the first driving mechanism, the folding mechanism to ascend, the method further includes: applying glue to one side in a thickness direction of the main body portion.

In one embodiment, the folding method further includes: during and/or after the operation of driving, by the second driving mechanism, the folding mechanism to move close to the bearing and fixing mechanism, curing the glue by the curing lamp disposed on a side of the folding mechanism opposite a side bearing the to-be-folded portion.

In one embodiment, the to-be-folded device is a display substrate, the main body portion includes a mini/micro light emitting diode (mini/micro LED) for display, and the to-be-folded portion includes a driving circuit configured to drive the mini/micro LED to emit light.

BRIEF DESCRIPTION OF DRAWINGS

The accompanying drawings, which are included to provide a further understanding of the disclosure and form a part of the specification, are described in conjunction with the following embodiments to explain the present disclosure, rather than limit the present disclosure. In the drawings.

DETAIL DESCRIPTION OF EMBODIMENTS

The embodiments of the present disclosure are described in further detail below with reference to the accompanying drawings. It should be understood that the embodiments described herein below are merely used to describe and explain the present disclosure only and are not intended to limit the present disclosure.

Unless otherwise defined, technical or scientific terms used in the embodiments of the present disclosure should have their ordinary meanings as understood by those of ordinary skill in the art to which the present disclosure belongs. The use of "first", "second", and the like in this disclosure is not intended to indicate any order, quantity, or importance, but rather is used to distinguish one component from other components. Similarly, the term "including" or "comprising", and the like, means that the element or item preceding the word includes the element or item listed after the word and its equivalent, but does not exclude other elements or items. The terms "connecting" or "connected", and the like, are not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

Figure 1:
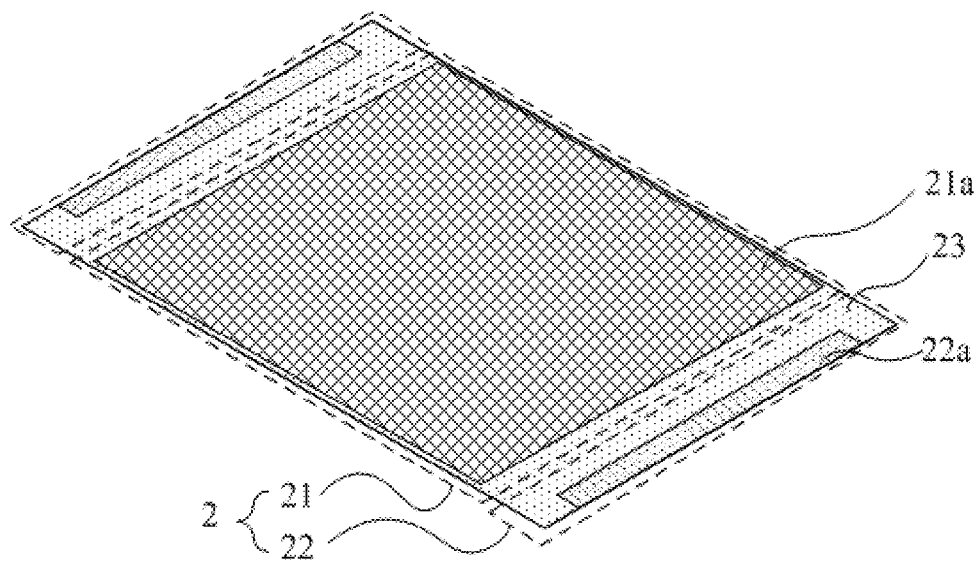
FIG. 1 is a schematic structural view of a to-be-folded device in a to-be-folded state according to some embodiments of the present disclosure.

The embodiment of the present disclosure provides a folding device configured to fold a to-be-folded device and fold a to-be-folded portion of the to-be-folded device to one side in a thickness direction of a main body portion of the to-be-folded device. The to-be-folded device may be a display substrate, the main body portion of the to-be-folded device may be a portion on the display substrate for display, and the to-be-folded portion may be a portion of the display substrate to be folded to the backlight side of the main body portion. FIG. 1 is a schematic structural view of a to-be-folded device according to some embodiments of the present disclosure. As shown in FIG. 1, in the embodiment of the present disclosure, the to-be-folded device 2 may include a main body portion 21 and a to-be-folded portion 22 on at least one side of the main body portion 21. Taking the to-be-folded device being a display substrate as an example, the main body portion 21 includes a light emitting device for display, such as a mini/micro light emitting diode (mini/micro LED), and the to-be-folded portion 22 includes a driving circuit 22a for driving the light emitting device to emit light. The light emitting device and the driving circuit 22a are both disposed on a flexible substrate 23, and the material of the flexible substrate 23 may include Polyimide (PI). The light emitting device and the driving circuit 22a may be connected through a signal line disposed on the flexible substrate 23, so that the driving circuit 22a can provide electric signals for display to the light emitting device through the signal line. The main body portion 21 further includes a bearing plate 21a of a comparatively great rigidity, such as a glass plate. The bearing plate 21a and the light emitting device are located on opposite surfaces of the flexible substrate 23. In the manufacturing process of the to-be-folded device 2, the to-be-folded portion 22 needs to be folded to the backlight side of the main body portion 21. In addition, a bearing plate may also be provided at the position of the driving circuit 22a, and the bearing plate and the driving circuit 22a are located on opposite surfaces of the flexible substrate 23.

Figure 2:
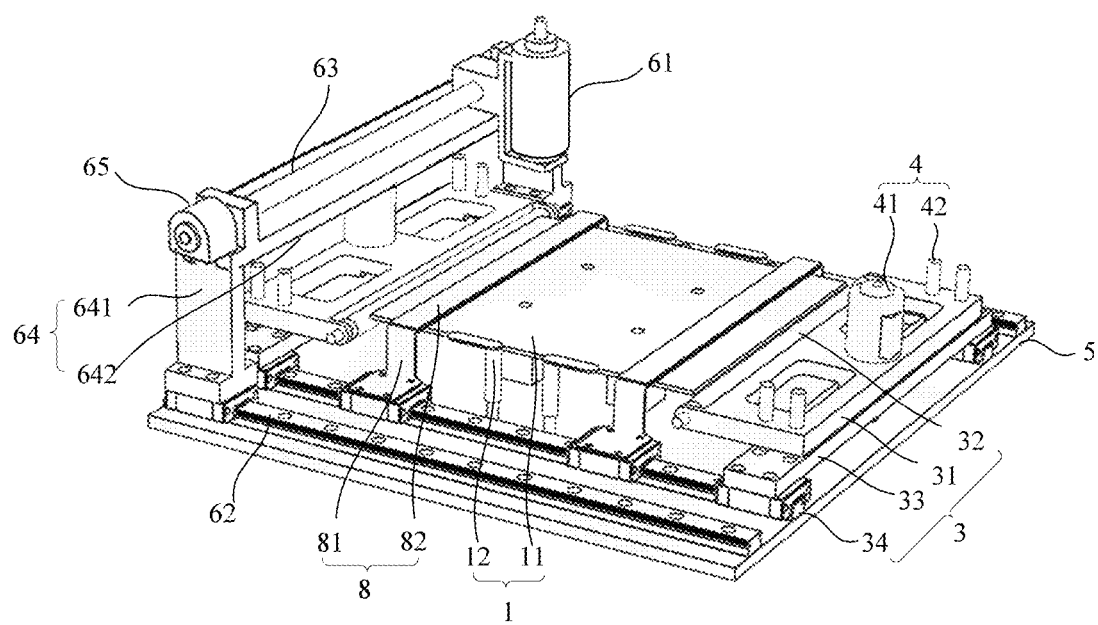
FIG. 2 is a schematic structural view of a folding device according to some embodiments of the present disclosure.

FIG. 2 is a schematic structural view of a folding device according to some embodiments of the present disclosure. As shown in FIG. 2, the folding device includes: a base 5, a bearing and fixing mechanism 1, a folding mechanism 3, a first driving mechanism 4 and a second driving mechanism 6 (see FIG. 5). The bearing and fixing mechanism 1 is disposed on the base 5 and configured to bear the main body portion 21 of the folding device 2 by a bearing surface (top surface) of the bearing and fixing mechanism 1. The bearing and fixing mechanism 1 is further configured to fix (secure) the main body portion 21 of the to-be-folded device 2 to ensure that the main body portion 21 does not move during the folding operation. The folding mechanism(s) 3 is disposed on at least one lateral side of the bearing and fixing mechanism 1, the folding mechanism 3 being configured to bear the to-be-folded portion 22 of the to-be-folded device 2 and perform a folding operation (which will be described in detail below). The first driving mechanism 4 is connected to the folding mechanism 3 to drive the folding mechanism 3 to move along a direction perpendicular to the bearing surface of the bearing and fixing mechanism 1. The second driving mechanism 6 is connected to the folding mechanism 3 to drive the folding mechanism 3 to move close to or away from the bearing and fixing mechanism 1 along a direction parallel to the bearing surface of the bearing and fixing mechanism. In processes of normal use, each of the base 5 and the bearing surface of the bearing and fixing mechanism 1 is disposed on a horizontal plane, so that movement along the direction perpendicular to the bearing surface means ascending and descending along a vertical direction, and the movement close to or away from the bearing and fixing mechanism 1 along the direction parallel to the bearing surface means movement close to or away from the bearing and fixing mechanism 1 along a horizontal direction. It should be understood that the movement close to the bearing and fixing mechanism described herein refers to movement approaching the center of the bearing and fixing mechanism. In this embodiment, the folding mechanism 3 is disposed on the base 5. Alternatively, the folding mechanism 3 may be disposed directly on the bearing and fixing mechanism 1 or on a fixing member other than the base 5. Furthermore, the bearing and fixing mechanism 1 and the base 5 may be integrated into one piece.

In the embodiments of the present disclosure, the to-be-folded device 2 may include one to-be-folded portion 22 or two to-be-folded portions 22. Taking the case that the to-be-folded device 2 includes two to-be-folded portions 22 as an example, the two to-be-folded portions 22 are located on opposite sides of the main body portion 21, respectively. The number of the folding mechanism 3 may be one or two. When the number of the folding mechanism 3 is two, the two folding mechanisms 3 may be disposed on two lateral sides of the bearing and fixing mechanism 1 along the first direction, and the two folding mechanisms 3 may be configured to bear two to-be-folded portions 22, respectively. Here, the first direction is a direction parallel to the bearing surface. Of course, the to-be-folded device 2 may also include three to-be-folded portions 22 located on three sides of the main body portion 21, or four to-be-folded portions 22 located on four sides of the main body portion 21. Accordingly, the number of the folding mechanism 3 may also be three or four. Each folding mechanism 3 correspondingly bears one to-be-folded portion 22. When the folding device includes at least two folding mechanisms 3, the first driving mechanism 4 and the second driving mechanism 6 are connected to the folding mechanisms 3 in one-to-one correspondence. A plurality of first driving mechanisms 4 may simultaneously drive a plurality of folding mechanisms 3 to ascend and descend, or may drive the plurality of folding mechanisms 3 to ascend and descend one after another. Similarly, a plurality of second driving mechanisms may simultaneously drive a plurality of folding mechanisms 3 to move horizontally, or may drive the plurality of folding mechanisms 3 to move horizontally one after another.

In addition, the folding device of the embodiment of the present disclosure may further include a controller (not shown) for controlling the first driving mechanism and the second driving mechanism. The controller is configured to, during a folding operation performed by the folding mechanism, first drive the first driving mechanism to ascend in a direction perpendicular to the bearing surface, and then drive the second driving mechanism to move in a direction approaching the bearing and fixing mechanism, so that the first rotating shaft moves along a predetermined inverted L-shaped path.

Compared with manual operation, when the folding device in the embodiment of the present disclosure folds the to-be-folded device 2, the folding force can be well controlled, the damage to the to-be-folded device 2 is reduced, large-scale production can be realized, and the operation efficiency is improved.

The folding device in the embodiment of the present disclosure is described in detail below with reference to the accompanying drawings by taking the to-be-folded device being a display substrate as an example.

As shown in FIG. 2, the folding mechanism 3 includes a first bearing stage 31, the bearing and fixing mechanism 1 includes a second bearing stage 11, and both the first bearing stage 31 and the second bearing stage 11 are disposed on the base 5. The bearing surface of the bearing and fixing mechanism 1 is also the bearing surface of the second bearing stage 11. When the folding mechanism 3 is in an initial state, the first bearing stage 31 and the second bearing stage 11 are arranged in the first direction.

Figure 3:
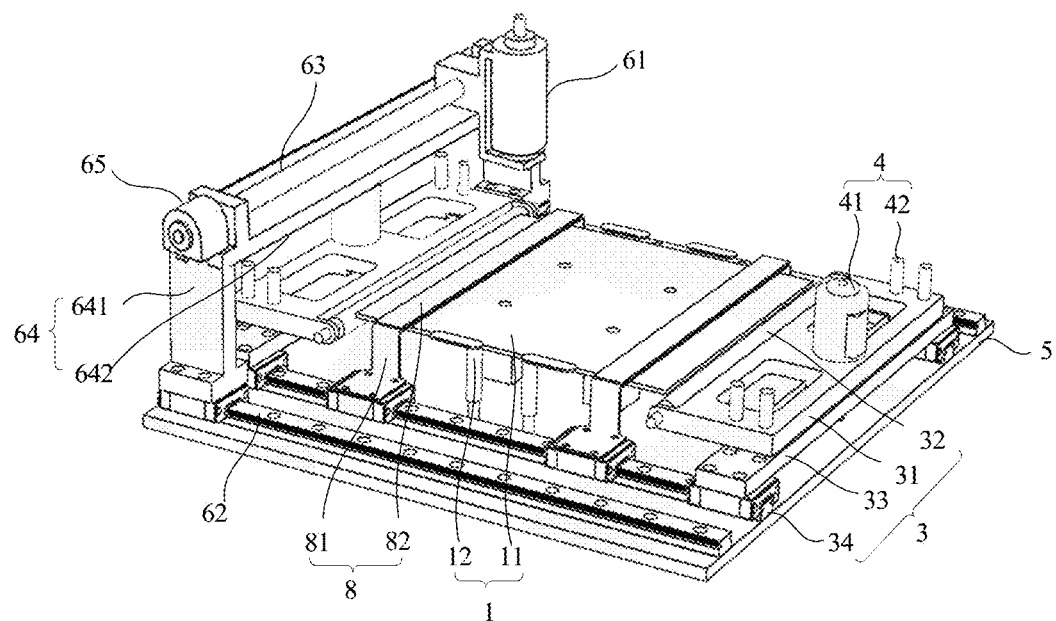
FIG. 3 is a schematic view of a folding device in which the fixing member is in a fixed state according to some embodiments of the present disclosure.

The present disclosure does not specifically limit the fixing manner of the bearing and fixing mechanism 1 to the to-be-folded device, which serves as a specific embodiment of the present disclosure. As shown in FIG. 2, the bearing and fixing mechanism 1 further includes at least one fixing member 12 on at least one side of the bearing and fixing mechanism 1. In the embodiment shown in FIG. 2, two groups of fixing members 12 are located on two opposite lateral sides of the second bearing stage 11. The fixing members 12 may be disposed on the base 5. The fixing member 12 has a fixed state and an unfixed state. FIG. 3 is a schematic view of a folding device according to some embodiments of the present disclosure when the fixing member is in a fixed state. As shown in FIG. 3, a portion of the fixing member 12 in the fixed state is pressed against the main body portion 21. As shown in FIG. 2, an orthographic projection of the fixing member 12 in the unfixed state on a plane where the bearing surface is positioned may be located outside the bearing surface. The fixing member 12 and the folding mechanism 3 are located on different lateral sides of the second bearing stage 11. i.e. on different lateral sides of the bearing and fixing mechanism 1.

Illustratively, the folding device may include two groups of fixing members 12, each group includes two fixing members 12, and the two groups of fixing members 12 are disposed on two lateral sides of the second bearing stage 11 in a second direction, respectively, the second direction intersecting the first direction, for example, the second direction is perpendicular to the first direction. When the fixing member 12 is in the unfixed state, an orthographic projection of the fixing member 12 on the plane where the bearing surface is positioned may be located outside the bearing surface, so that the to-be-folded device 2 can be taken down from the second bearing stage. When the fixing member 12 is in the fixed state, a portion of the fixing member 12 is pressed against the main body portion 21, so that the main body portion 21 is fixed on the bearing surface of the second bearing stage 11. It should be noted that the number of the fixing member 12 mentioned above is only exemplary, and in practical applications, the fixing member 12 may be provided in other numbers.

Figure 4A:
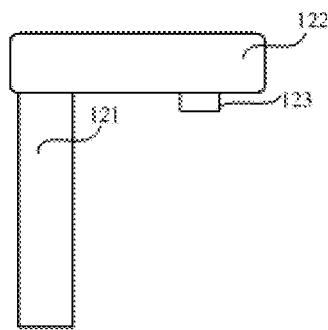
FIG. 4a is a schematic structural view of the fixing member according to some embodiments of the present disclosure.

FIG. 4a is a schematic structural view of a fixing member according to some embodiments of the present disclosure. As shown in FIGS. 2 to 4a, in some embodiments, the fixing member 12 includes: a second rotating shaft 121, a fixing part 122 and a pressing part 123 disposed on the fixing part 122. The second rotating shaft 121 is disposed on the base 5. The fixing part 122 is rotatably connected to the base 5 through a second rotating shaft 121. The pressing part 123 has a pressing surface facing toward the to-be-folded device 2, the pressing part 123 is movable close to or away from the base 5, and the pressing part 123 is pressed against the main body portion 21 when the fixing member 12 is in the fixed state.

The embodiment of the present disclosure does not limit the manner in which the pressing part 123 moves close to or away from the base. For example, the pressing part 123 may be driven to move in a pneumatic manner. Illustratively, a gas cavity is formed in the fixing part 122, a mounting hole is formed in a bottom wall of the gas cavity, a portion of the pressing part 123 is hermetically disposed in the mounting hole, and the pressing part 123 is driven to move close to or away from the base 5 by inputting gas into or extracting gas from the gas cavity in the fixing part 122.

In the embodiment of the present disclosure, a bottom end of the second rotating shaft 121 may be fixed on the base 5, and the fixing part 122 is rotatably connected to the second rotating shaft 121, or the fixing part 122 is fixedly connected to the second rotating shaft 121, and the bottom end of the second rotating shaft 121 is rotatably connected to the base 5.

For example, as shown in FIGS. 2 and 4a, the fixing part 122 can rotate around an axis of the second rotating shaft 121. When the fixing member 12 needs to be switched to the unfixed state, the pressing part 123 may be controlled to ascend, so that the pressing part 123 does not contact with the main body portion 21, and the fixing part 122 is controlled to rotate out of the second bearing stage 11 (as shown in FIG. 3). When the fixing member 122 needs to be switched to the fixed state, the fixing member 122 may be controlled to rotate so that the pressing part 123 is located above the second bearing stage 11, and the pressing part 123 is controlled to descend to press against the main body portion 21, and the main body portion 21 and the second bearing stage 11 are kept to be relatively fixed.

Figure 4B:
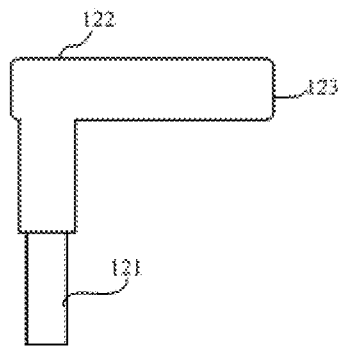
FIG. 4b is a schematic structural view of the fixing member according to other embodiments of the present disclosure.

FIG. 4b is a schematic structural view of a fixing member according to another embodiment of the present disclosure. Like the fixing member 12 shown in FIG. 4a, the fixing member shown in FIG. 4a includes: a second rotating shaft 121, a fixing part 122, and a pressing part 123 disposed on the fixing part 122. Unlike the fixing member 12 shown in FIG. 4a, in FIG. 4b, the pressing part 123 is located at the top end of the fixing part 122 and is fixedly connected to the fixing part 122. Illustratively, the fixing part 122 is a hollow structure with a mounting hole formed in the bottom, a portion of the second rotating shaft 12 extends into the fixing part 122 through the mounting hole, and the fixing part 122 can rotate around the second rotating shaft 121 and can ascend and descend relative to the second rotating shaft 121.

In some embodiments, the switching of the fixing member 12 between the fixed state and the unfixed state may be controlled manually or automatically. For example, in some embodiments, the bearing and fixing mechanism 1 further includes: a first driving member (not shown) connected to the fixing member 12 for driving the fixing member 12 to switch between the fixed state and the unfixing state.

In the above embodiment, the main body portion 21 of the to-be-folded device 2 is fixed on the second bearing stage 11 by the fixing member 12. Such fixing manner can prevent the light emitting device of the main body portion 21 from being damaged. However, it should be noted that the fixing manner of the main body portion 21 is not limited hereto. For example, a vacuum absorption hole may be provided on the main body portion 21 to fix the main body portion on the second bearing stage through vacuum absorption. Of course, the two fixing manners may be combined, that is, a vacuum absorption hole is provided on the second bearing stage 11 while the fixing member 12 is provided. Further, the structure of the fixing member 12 is not limited to the structure shown in FIGS. 4a and 4b, but may be a structure capable of ascending and descending only, or be a snap structure, a spring structure, a hinge structure, or the like.

In some embodiments, the bearing and fixing mechanism 1 may further include: a limiter (not shown) disposed on at least one side of the second bearing stage 11, a portion of the limiter being located on an upper surface of the second bearing stage 11 and adjacent to a boundary of a predetermined region of the upper surface of the second bearing stage 11, the predetermined region being a region for bearing the main body portion 21. When the main body portion 21 of the to-be-folded device 2 is placed on the second bearing stage 11, the boundary of the to-be-folded device 2 may be in contact with the limiter 15 to improve the position accuracy of placement of the to-be-folded device 2.

In some embodiments, as shown in FIG. 2, the folding device 3 further includes: a first guide rail 33 and a mounting seat 34. The first guide rail 33 is disposed on the base 5 and extends in a first direction. When the folding device 3 includes one or two folding mechanisms 3, the first direction is an arrangement direction of the bearing and fixing mechanism 1 and the folding mechanism 3 when the folding device is in an initial state. The mounting seat 34 is disposed on the first guide rail 33 and is movable along the first guide rail 33, and the folding mechanism 3 is disposed on the mounting seat 34.

In some embodiments, the first driving mechanism 4 includes: a guide shaft 42 and a screw motor 41, one end of the screw motor 41 is fixedly disposed on the mounting base 34, and the other end of the screw motor passes through the first bearing stage 31. The screw motor 41 includes a motor body and a screw. The motor body is disposed on one side of the first bearing stage 1 away from the base 5, and the screw of the screw motor passes through the first bearing stage 31. The screw motor 41 is configured to drive a screw of the screw motor 41 to rotate, so as to drive the first bearing stage 31 to ascend and descend along the guide shaft 42.

In some embodiments, the folding device further includes: a gluing mechanism and a curing mechanism. The gluing mechanism is configured to apply glue to a to-be-folded device. The curing mechanism is configured to cure the glue on the to-be-folded device. The gluing mechanism may apply glue to a region on the bearing plate 21a close to the to-be-folded portion 22, so that the to-be-folded portion 22 is bonded to the bearing plate 21a through glue when being folded onto the bearing plate 21a.

In some embodiments, as shown in FIG. 2, the gluing mechanism includes: an gluing head 61, a second guide rail 62, a third guide rail 63 and a stand 64. The second guide rail 62 is disposed on the base 5 and extends in a first direction. The stand 64 is disposed on the second guide rail 62 and is movable along the second guide rail 62. The third guide rail 63 is disposed on the stand 64 and extends in a second direction. The gluing head 61 is disposed on the third guide rail 63 and is configured to output glue, and the gluing head 61 is movable along the third guide rail 63.

In some embodiments, the bearing and fixing mechanism 1 is provided with second guide rails 62 on both sides extending in the first direction. The stand 64 includes: two upright portions 641 disposed opposite to each other. The two upright portions 641 are disposed on the second guide rails 62 on both sides of the bearing and fixing mechanism 1, respectively. The third guide rail 63 is located between the two upright portions 641, and the upright portions 641 are movable along the second guide rails 62. Optionally, the stand 64 further includes: a horizontal portion 642 connected between the two upright portions 641, and the third guide rail 63 is located on a side of the horizontal portion 642 away from the base 5.

In order to improve the production efficiency, in some embodiments, the gluing mechanism further includes: a second driving member (not shown) and a third driving member 65. The second driving member is connected to the stand 64 for driving the stand 64 to move along the second guide rail 62. The third driving member 65 is connected to the gluing head 61 for driving the gluing head to move along the third guide rail 63.

Illustratively, the second driving member may be a driving mechanism such as a linear cylinder: the third driving member 65 may be a screw motor, the third guide rail 63 is a screw guide rail, and the third driving member 65 drives the third guide rail 63 to rotate, so as to drive the gluing head 61 to move along an extending direction of the third guide rail 63.

Figure 5:
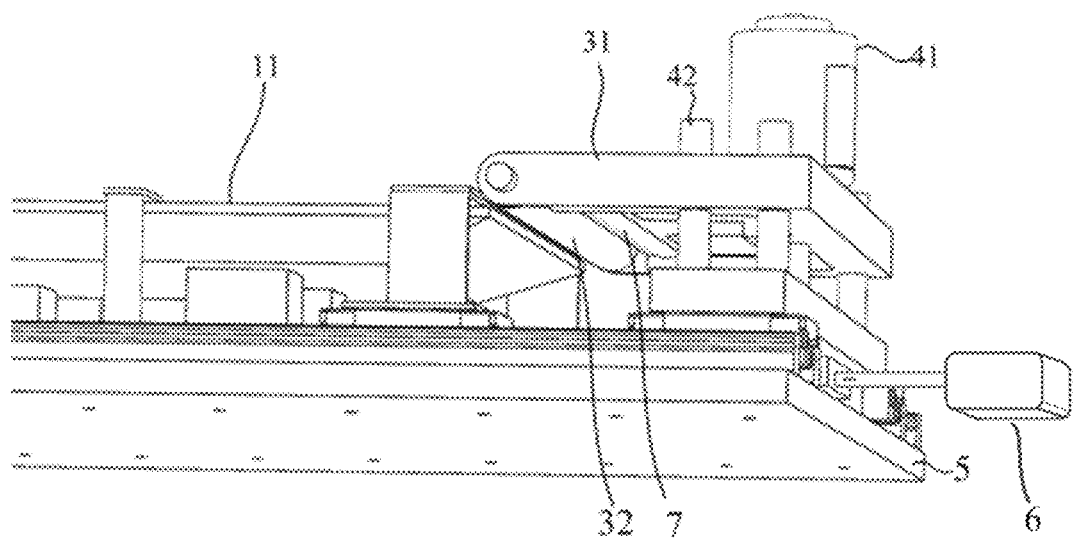
FIG. 5 is a schematic view of a partial structure of a folding device according to some embodiments of the present disclosure.

In some embodiments, the curing mechanism includes a curing lamp, such as an ultraviolet (UV) lamp. FIG. 5 is a schematic view of a partial structure of a folding device according to some embodiments of the present disclosure. As shown in FIG. 5, a curing lamp 7 is disposed on a side of the folding mechanism 3 opposite a side bearing the to-be-folded portion, i.e., the curing lamp 7 faces toward the base 5. Specifically, the curing lamp 7 is disposed on a surface of the first bearing stage 31 facing toward the base 5. In the operation that the folding mechanism 3 moves close to the bearing and fixing mechanism 1 along a direction parallel to a bearing surface of the bearing and fixing mechanism 1, the curing lamp 7 cures the glue on the to-be-folded device 2.

Figure 13:
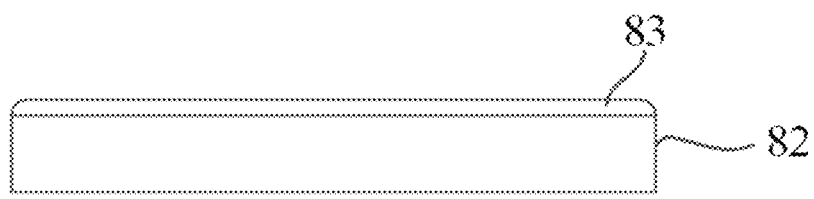
FIG. 13 is a sectional view of a beam and a buffer layer of a protective frame of the folding device according to some embodiments of the present disclosure.

In some embodiments, as shown in FIG. 2, the folding device further includes: a protective frame 8 including a sliding portion 81, a beam 82, and a buffer layer 83 (see FIG. 13). The sliding portion 81 is disposed on the first guide rail 33 and is movable along the first guide rail 33. The beam 82 is connected to the sliding portion 81, and is located on a side of the bearing and fixing mechanism 1 away from the base 5. The buffer layer 83 is disposed on a surface of the beam 82 away from the base 5. For example, the buffer layer 83 may be a foam layer, a plastic layer, or other film layer having a buffering effect. When the folding mechanism 3 ascends/descends and is horizontally displaced such that the to-be-folded portion 22 slides off the folding mechanism 3, the buffer layer 83 can prevent the to-be-folded portion 22 from colliding with the main body portion 21 to damage the device. After the to-be-folded portion 22 drops onto the buffer layer 83, the protective frame 8 may be moved so that the to-be-folded portion 22 and the main body portion 21 are bonded together.

Figure 6:
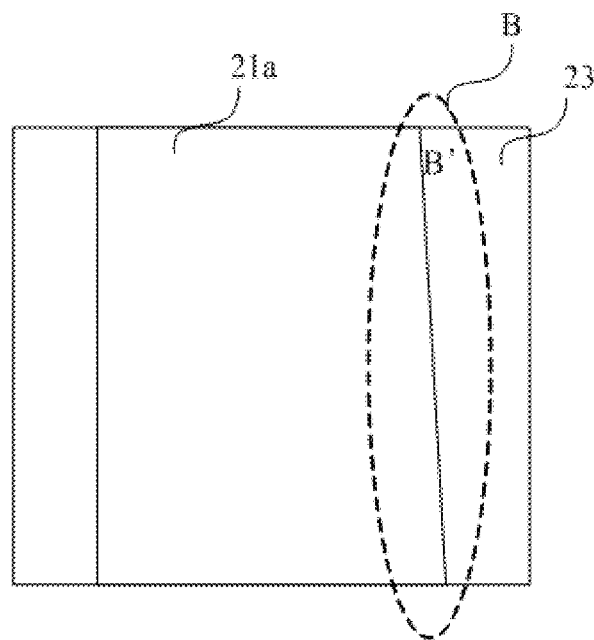
FIG. 6 is a schematic view illustrating an edge of a bearing plate being inclined.
Figure 7:
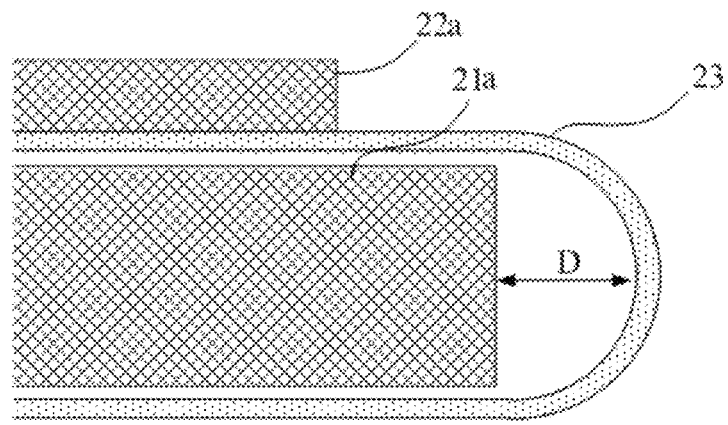
FIG. 7 is a schematic view illustrating the folding effect of the to-be-folded device when the edge of the bearing plate is inclined.

In an actual manufacturing process, due to technical errors, process errors and the like, an edge of the bearing plate 21a of the main body portion 21 may be inclined by a certain angle, that is, every two adjacent edges of the bearing plate 21a may not be perpendicular to each other. At this time, after the to-be-folded device 2 is folded, a large gap is generated between the flexible substrate 23 and the edge of the bearing plate 21a. FIG. 6 is a schematic view illustrating an edge of the bearing plate being inclined. FIG. 7 is a schematic view illustrating the folding effect of the to-be-folded device in a case where the edge of the bearing plate is inclined. As shown in FIGS. 6 and 7, in a non-ideal situation, an edge of the bearing plate 21a in region B is not perpendicular to its adjacent edge. At this time, after the to-be-folded device 2 is folded, a gap D is generated between the flexible substrate 23 and a side surface of the bearing plate 21a, and the closer to the position B', the larger the generated gap D is, which would further affect the subsequent processes.

Figure 8A:
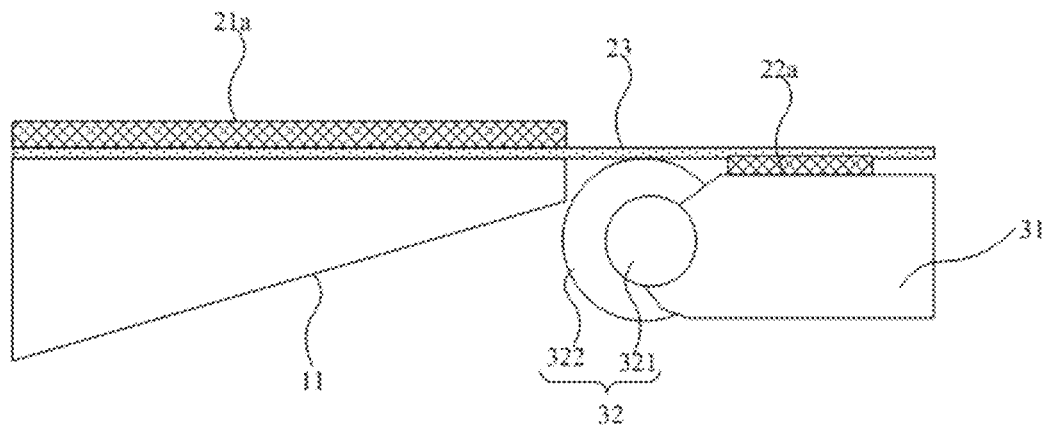
FIGS. 8a to 8e are schematic views illustrating a folding process of a to-be-folded device according to some embodiments of the present disclosure.

To this end, the embodiment of the present disclosure solves the above problem by providing an elastic rotating shaft in the folding mechanism. FIGS. 8a to 8e are schematic views illustrating a folding process of a to-be-folded device according to some embodiments of the present disclosure. As shown in FIGS. 8a, 2 and 5, in some embodiments, the folding mechanism 3 further includes a first rotating shaft 32. The first rotating shaft 32 is disposed on a side of the first bearing stage 31 close to the bearing and fixing mechanism 1. The first rotating shaft 32 includes a rotating shaft body 321 and a flexible layer 322 disposed around the rotating shaft body 321. For example, the flexible layer 322 includes a layer of material that is easily deformable, such as a foam pad.

It should be understood that, the side of the first bearing stage 31 close to the bearing and fixing mechanism 1 refers to a side of the first bearing stage 31 close to the bearing and fixing mechanism 1 when the folding mechanism 3 is in the initial state (i.e. before the to-be-folded device 2 is folded by the folding device).

Figure 12:
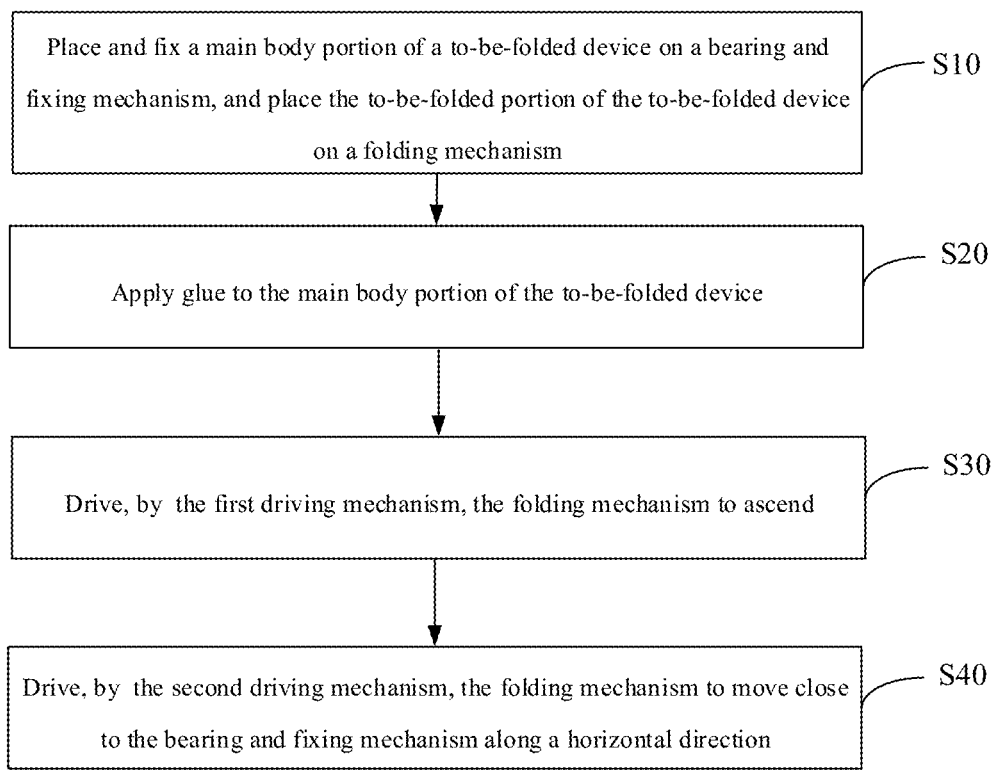
FIG. 12 is a flow chart of a folding operation performed by the folding mechanism according to some embodiments of the present disclosure.

FIG. 12 is a flow chart of a folding operation performed by the folding mechanism according to some embodiments of the present disclosure. Referring to FIG. 12 and FIGS. 8a to 8e, when the to-be-folded device 2 is folded by the folding device of the embodiment of the present disclosure, the following operations are implemented:

Operation S10: placing and fixing a main body portion 21 of a to-be-folded device 2 on a bearing and fixing mechanism 1, and placing the to-be-folded portion 22 of the to-be-folded device 2 on a folding mechanism 3. This fixing operation may be implemented by the fixing member 12 described above. As shown in FIG. 8a, at this time, the bearing plate 21a of the main body portion 21 and a portion the flexible substrate 23 corresponding to the bearing plate 21a are located on a second bearing stage 11 of the bearing and fixing mechanism 1. An edge of the bearing plate 21a close to the folding mechanism 3 is substantially aligned with an edge of the bearing and fixing mechanism 1 close to the folding mechanism 3 (i.e., the right edge of the bearing plate 21a and the right edge of the second bearing stage 11 as shown in FIG. 8a). The bearing plate 22a of the to-be-folded portion 22 and a portion of the flexible substrate 23 corresponding to the bearing plate 22a are located on the first bearing stage 31 of the folding mechanism 3, a portion of the flexible substrate 23 between the bearing plates 21a and 22a is located on the first rotating shaft 32, the bearing plate 22a of the to-be-folded portion 22 is located between the flexible substrate 23 and the first bearing stage 31, and a portion of the flexible substrate 23 corresponding to the bearing plate 21a is located between the bearing plate 21a and the second bearing stage 11. In addition, in this initial state, the flexible layer 322 of the folding mechanism 3 may not contact with the second bearing stage 11 and is not deformed.

Figure 8B:
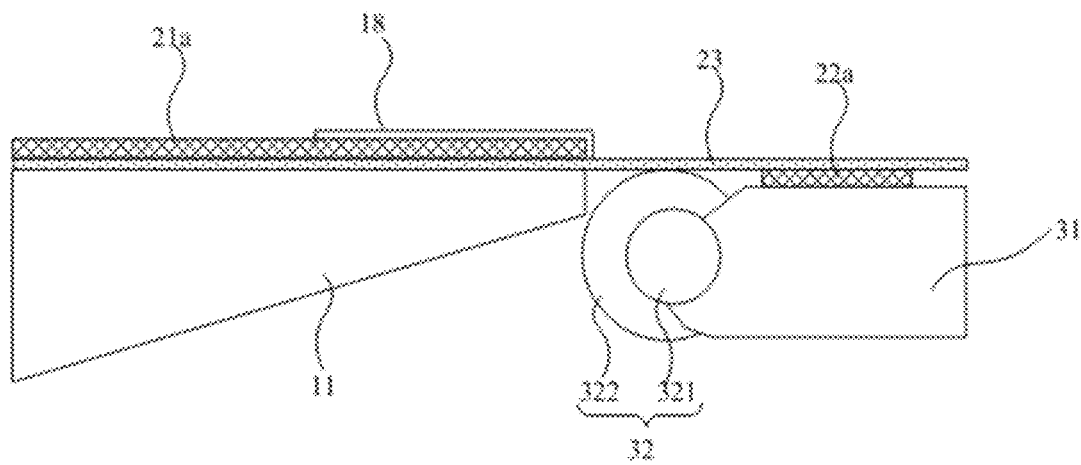

Operation S20, applying glue to the main body portion 21 of the to-be-folded device 2. Specifically, glue 18 is applied (coated) to a region of the bearing plate 21a on the main body portion 21 close to the bearing plate 22a. This coating operation may be performed by the gluing mechanism described above. The state after the coating operation is as shown in FIG. 8b. It should be noted that, in some embodiments, the coating operation may also be performed before operation S10. In addition, for embodiments where the application of the glue is not required, operation S20 may be omitted.

Figure 8C:
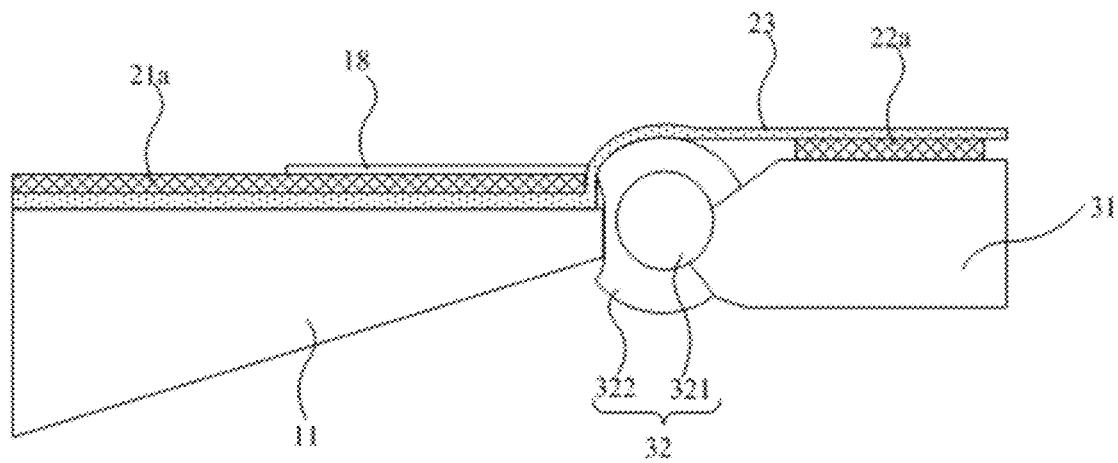
Figure 8D:
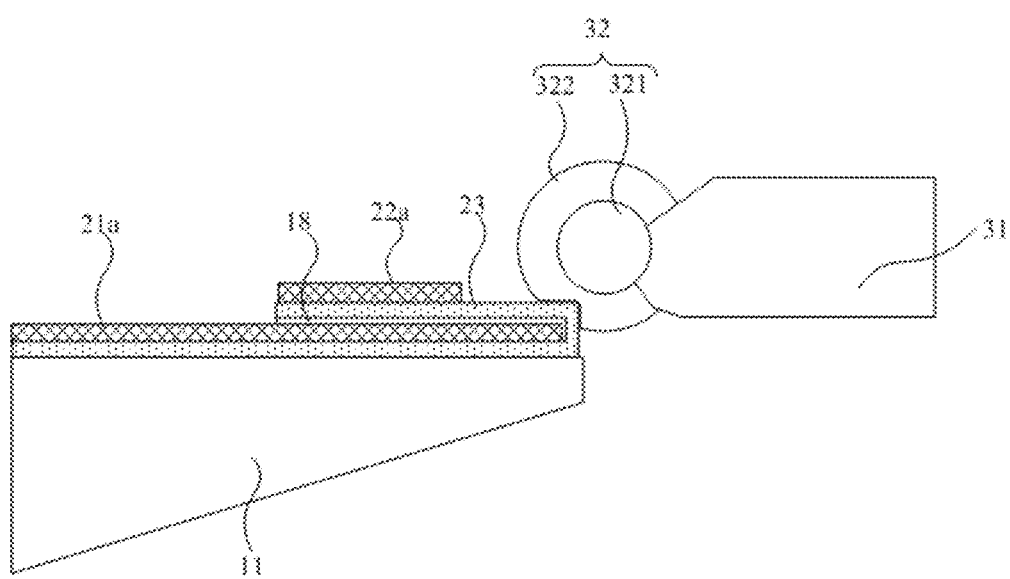

In operation S30, driving, by the first driving mechanism 4, the folding mechanism 3 to ascend. As shown in FIG. 8c, when the first driving mechanism 4 drives the folding mechanism 3 to ascend, the flexible layer 322 presses a side surface (lateral side) of the second bearing stage 11 and presses the flexible substrate 23 toward a side surface of the bearing plate 21a, thereby reducing or eliminating the gap between the side surface of the bearing plate 21a and the flexible substrate 23.

Figure 8E:
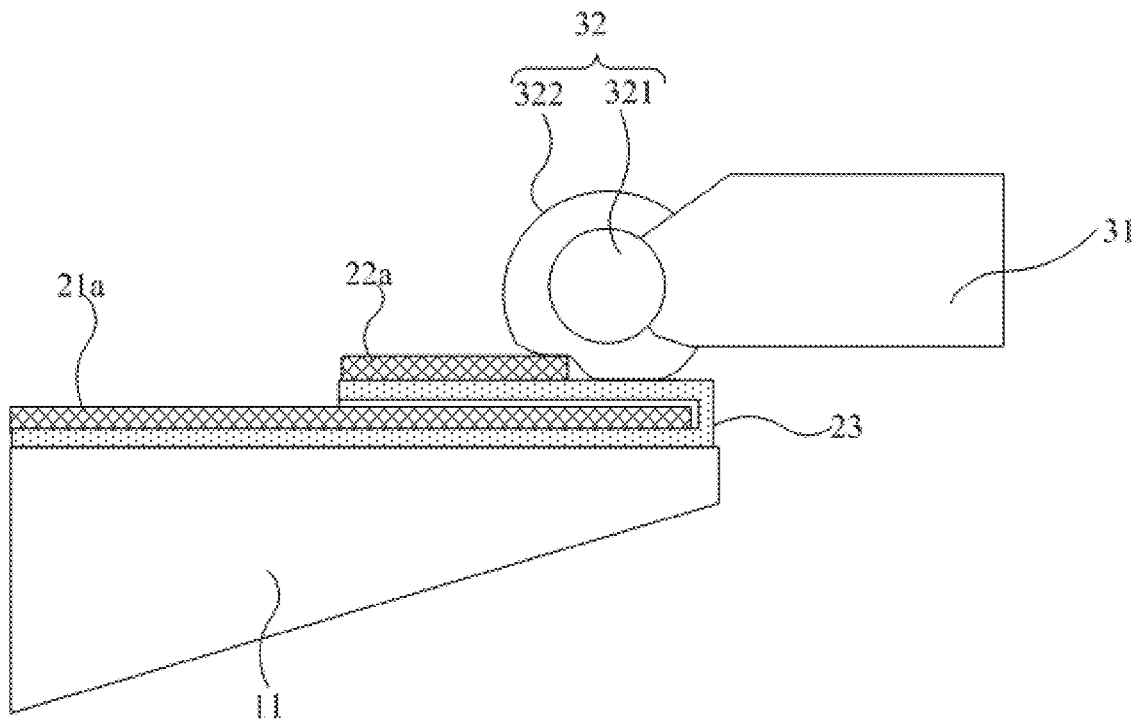

In operation S40, driving, by the second driving mechanism 6, the folding mechanism 3 to move close to the bearing and fixing mechanism 1 along a horizontal direction. During the movement of the folding mechanism 3 close to the bearing and fixing mechanism 1, the portion of the to-be-folded portion 22 positioned on the folding mechanism 3 gradually become smaller, which would eventually cause the entire to-be-folded portion 22 to be folded and fall onto one side (the upper side in FIG. 8d) of the main body portion 21 in a thickness direction 2. As the folding mechanism 3 continues to move, the flexible layer 322 presses the flexible substrate 23 of the to-be-folded device 2 toward the main body portion 21, so that the flexible substrate 23 fits with an upper surface and a side surface of the bearing plate 21a more tightly, as shown in FIG. 8e.

In some embodiments, during and/or after operation S40, the glue on the to-be-folded device 2 is cured by the curing lamp 7. Further, in some embodiments, operation S30 and operation S40 may partially overlap on another. In the overlapping process, the folding mechanism 3 is driven by the second driving mechanism 6 to move close to the bearing and fixing mechanism 1 while being driven to ascend by the first driving mechanism 4, so as to move along a predetermined curve.

Figure 9:
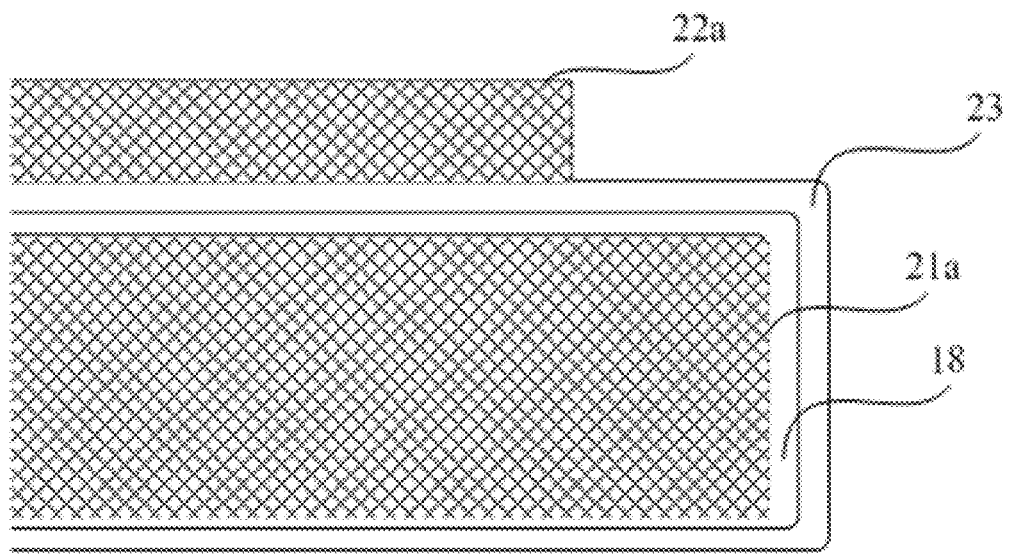
FIG. 9 is a schematic view illustrating an effect of the to-be-folded device after being folded according to some embodiments of the present disclosure.

FIG. 9 is a schematic view illustrating the effect of the to-be-folded device after being folded according to some embodiments of the present disclosure. As shown in FIGS. 7 and 9, after the to-be-folded device 2 is folded by the folding device of the present embodiment, there is small or no gap existing between the side surface (including the lateral side surface) of the bearing plate 21a and the flexible substrate 23, so that the side surface of the bearing plate 21a and the flexible substrate 23 can be tightly bonded through the glue 18.

It can be appreciated that, since the folding device of the present embodiment can utilize the flexible layer 322 of the first rotating shaft 32 to press (squeeze) the flexible substrate 23 of the to-be-folded device 2 when folding the to-be-folded device 2, the flexible substrate 23 is tightly bonded to the side surface of the bearing plate 21a. Consequently, even compared to the to-be-folded device 2 that is normally folded (i.e., in a case where the edge of the bearing plate 21a is not inclined), the folding device of the present embodiment can produce a tighter bonding effect.

In some embodiments, the first bearing stage 31 has a thickness less than the diameter of the first rotating shaft 32. Herein the diameter of the first rotating shaft 32 refers to the diameter of the first rotating shaft 32 when the flexible layer 322 is not being pressed. This ensures that the flexible layer 322 of the first rotating shaft 32 can press (squeeze) the flexible substrate 23 of the to-be-folded device when the folding mechanism 3 moves horizontally.

Figure 10:
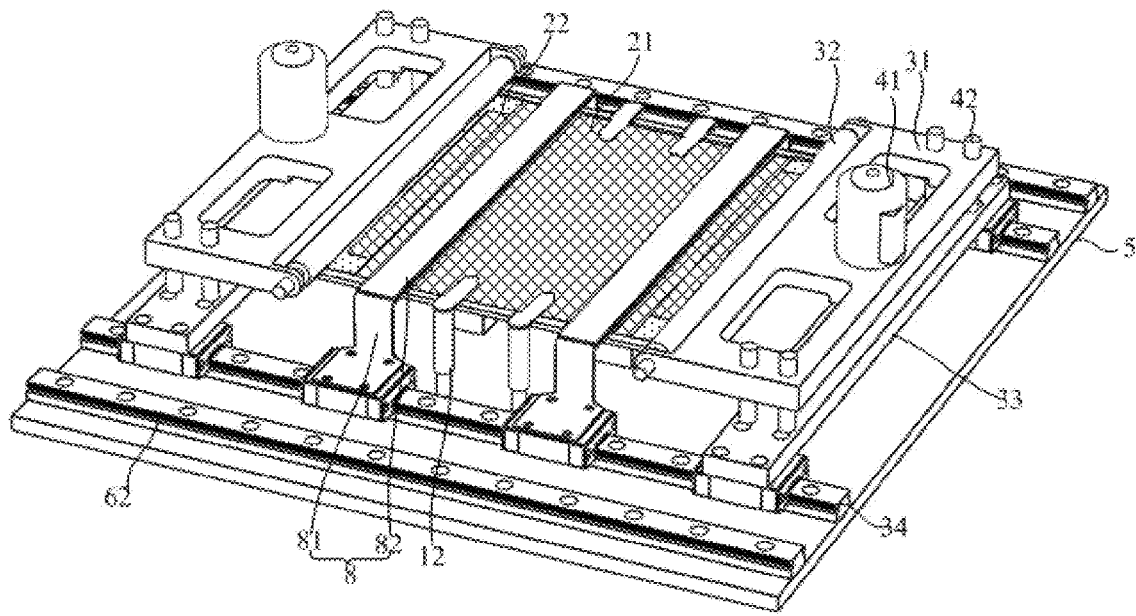
FIG. 10 is a schematic view illustrating the folding mechanism after ascending according to some embodiments of the present disclosure.
Figure 11:
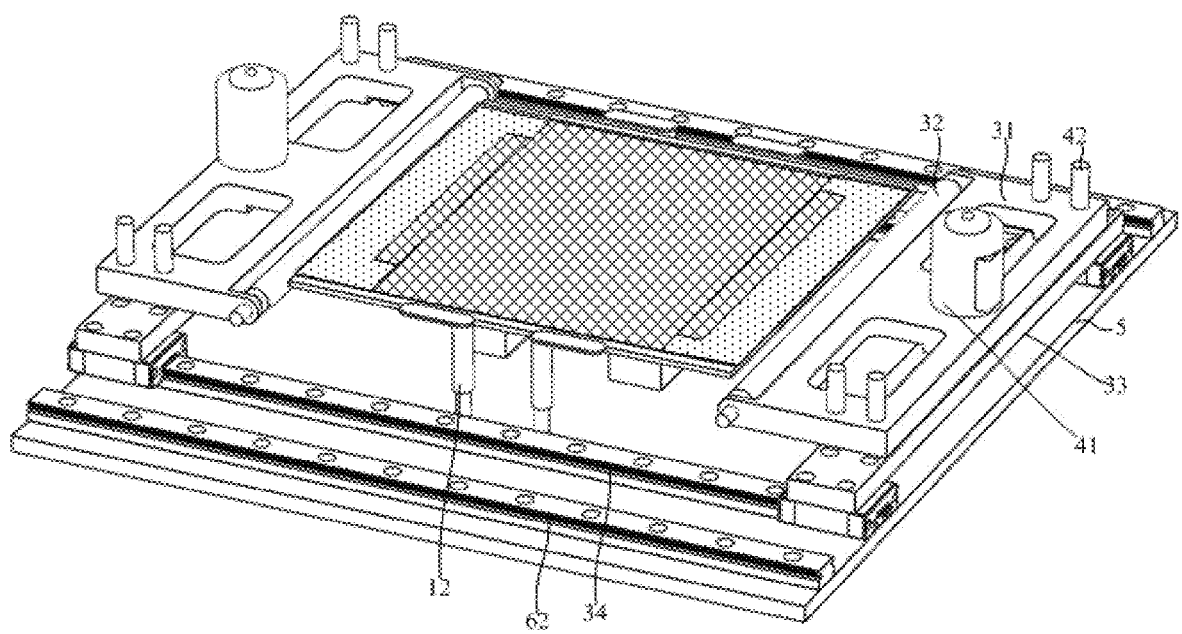
FIG. 11 is a schematic view illustrating the folding mechanism after descending according to some embodiments of the present disclosure.

FIG. 10 is a schematic view illustrating the folding mechanism after ascending according to some embodiments of the present disclosure. FIG. 11 is a schematic view illustrating the folding mechanism after descending according to some embodiments of the present disclosure. Neither FIG. 10 nor FIG. 11 shows the gluing mechanism, and FIG. 11 does not show the protective frame 8. The folding process of the to-be-folded device is described below with reference to the accompanying drawings.

In an initial state, as shown in FIG. 3, two folding mechanisms 3 are located at opposite sides of the bearing and fixing mechanism 1 in the first direction, respectively, the main body portion 21 of the to-be-folded device 2 is located on the upper surface of the second bearing stage 11, and the fixing member 12 is in a fixed state, so that the main body portion 21 is fixed on the second bearing stage 11. The to-be-folded portion 22 of the to-be-folded device 2 is located on an upper surface of the first bearing stage 31. Then, the second driving member drives the stand 64 to move to a region of the main body portion 21 close to the to-be-folded portion 22, and the third driving member 65 drives the gluing mechanism 61 to move in the second direction to apply glue. After the glue application is completed, the first driving mechanism 4 drives the first bearing stage 31 to ascend, and then the second driving mechanism 6 drives the first bearing stage 31 to move horizontally toward the second bearing stage 11, so that the to-be-folded portion 22 on the first bearing stage 31 is folded onto the beam 82 above the main body portion 21. Thereafter, as shown in FIG. 10, the first bearing stage 31 and the protective frame 8 are driven to move along the first guide rail 33, so that the to-be-folded portion 22 is tightly bonded to the main body portion 21 under the pressing action of the first rotating shaft 32. Finally, as shown in FIG. 11, the first bearing stage 31 is driven to move to its initial position, and the fixing member 12 is controlled to switch to the unfixed state so the to-be-folded device 2 may be removed.

It should be understood that above embodiments are just examples for illustrating the principle of the invention only, however, the invention is not limited thereto. Various modifications and variations can be made by a person skilled in the art without departing from the scope of the present disclosure. These modifications and variations should be considered to be within the protection scope of the present disclosure.

What is claimed is:
1. A folding device comprising:
  a bearing and fixing mechanism configured to bear and fix a main body portion of a to-be-folded device;
  a folding mechanism disposed on at least one lateral side of the bearing and fixing mechanism, the folding mechanism being configured to bear a to-be-folded portion of the to-be-folded device and fold the to-be-folded portion to one side in a thickness direction of the main body portion;
  a first driving mechanism connected to the folding mechanism and configured to drive the folding mechanism to move along a direction perpendicular to a bearing surface, which bears the main body portion, of the bearing and fixing mechanism; and
  a second driving mechanism connected to the folding mechanism and configured to drive the folding mechanism to move close to or away from the bearing and fixing mechanism along a direction parallel to the bearing surface,
  wherein the folding mechanism comprises:
    a first bearing stage; and
    a first rotating shaft disposed on a side of the first bearing stage facing toward the bearing and fixing mechanism, the first rotating shaft comprising a rotating shaft body and a flexible layer disposed around the rotating shaft body, the rotating shaft body being rotatably connected to the first bearing stage.
2. The folding device of claim 1, wherein the first bearing stage has a thickness less than a diameter of the first rotating shaft.
3. The folding device of claim 1, wherein the folding device further comprises:
  a base on which the bearing and fixing mechanism is disposed;
  a first guide rail disposed on the base and extending in a first direction; and
  a mounting seat disposed on the first guide rail and movable along the first guide rail;
  wherein, the folding mechanism is disposed on the mounting seat.
4. The folding device of claim 3, wherein the first driving mechanism comprises:
  a guide shaft having one end fixedly disposed on the mounting seat and the other end passing through the first bearing stage; and
  a screw motor, a screw of the screw motor passing through the first bearing stage, the screw motor being configured to drive the screw of the screw motor to rotate so as to drive the first bearing stage to ascend and descend along the guide shaft.
5. The folding device of claim 3, further comprising: a protective frame, wherein the protective frame comprises:
  a sliding portion disposed on the first guide rail and movable along the first guide rail;
  a beam connected to the sliding portion and positioned on a side of the bearing and fixing mechanism away from the base; and
  a buffer layer disposed on a surface of the beam away from the base.
6. The folding device of claim 1, wherein the bearing and fixing mechanism comprises:
  a fixing member disposed on at least one lateral side of the bearing and fixing mechanism, the fixing member having a fixed state and an unfixed state, wherein a portion of the fixing member in the fixed state is pressed against the main body portion; and an orthographic projection of the fixing member in the unfixed state on a plane where the bearing surface is positioned is located outside the bearing surface;
  wherein the fixing member and the folding mechanism are located on different sides of the bearing and fixing mechanism.
7. The folding device of claim 6, further comprising:
  a base on which the bearing and fixing mechanism is disposed, and wherein
  the fixing member comprises:
  a second rotating shaft disposed on the base;
  a fixing part rotatably connected to the base through the second rotating shaft; and
  a pressing part disposed on the fixing part, wherein the pressing part has a pressing surface facing toward the to-be-folded device, the pressing part is movable close to or away from the base, and the pressing surface is configured to press against the main body portion on the bearing and fixing mechanism when the fixing member is in the fixed state.
8. The folding device of claim 1, further comprising:
  a gluing mechanism configured to apply glue to the to-be-folded device; and
  a curing mechanism configured to cure the glue on the to-be-folded device.
9. The folding device of claim 8, wherein the gluing mechanism comprises:
  a second guide rail extending in a first direction;
  a stand disposed on the second guide rail and movable along the second guide rail;
  a third guide rail disposed on the stand and extending in a second direction, the second direction intersecting the first direction; and
  an gluing head disposed on the third guide rail and configured to output the glue, the gluing head being movable along the third guide rail.

10. The folding device of claim 9, wherein the gluing mechanism further comprises:
a third driving member connected to the gluing head and configured to drive the gluing head to move along the third guide rail.

11. The folding device of claim 8, wherein the curing mechanism comprises a curing lamp disposed on a side of the folding mechanism opposite a side bearing the to-be-folded portion.

12. The folding device of claim 1, further comprising a controller configured to control the first driving mechanism and the second driving mechanism,
wherein the controller is configured to first drive the first driving mechanism to ascend in a direction perpendicular to the bearing surface and then drive the second driving mechanism to move in a direction approaching the bearing and fixing mechanism, during a folding operation of the folding mechanism.

13. A folding method implemented by a folding device to a to-be-folded device, wherein the folding device comprises a bearing and fixing mechanism, a folding mechanism, a first driving mechanism and a second driving mechanism, the folding mechanism being disposed on at least one lateral side of the bearing and fixing mechanism,
the folding method comprising operations of:
placing and fixing a main body portion of the to-be-folded device on a bearing surface of the bearing and fixing mechanism, and placing a to-be-folded portion of the to-be-folded device on the folding mechanism;
driving, by the first driving mechanism, the folding mechanism to ascend along a direction perpendicular to the bearing surface; and
driving, by the second driving mechanism, the folding mechanism to move close to the bearing and fixing mechanism along a direction parallel to the bearing surface, so as to fold the to-be-folded portion to one side in a thickness direction of the main body portion,
wherein the folding device comprises:
a first bearing stage; and
a first rotating shaft disposed on a side of the first bearing stage facing toward the bearing and fixing mechanism, the first rotating shaft comprising a rotating shaft body and a flexible layer disposed around the rotating shaft body, the rotating shaft body being rotatably connected to the first bearing stage, and wherein
in the operation of driving, by the first driving mechanism, the folding mechanism to ascend, the flexible layer is deformed due to pressing the lateral side of the bearing and fixing mechanism, and
in the operation of driving, by the second driving mechanism, the folding mechanism to move close to the bearing and fixing mechanism, the flexible layer presses the to-be-folded portion toward the main body portion.

14. The folding method of claim 13, wherein prior to driving, by the first driving mechanism, the folding mechanism to ascend, the method further comprises:
applying glue to one side in a thickness direction of the main body portion.

15. The folding method of claim 14, further comprising:
during and/or after the operation of driving, by the second driving mechanism, the folding mechanism to move close to the bearing and fixing mechanism, curing the glue by a curing lamp disposed on a side of the folding mechanism opposite a side bearing the to-be-folded portion.

16. The folding method of claim 13, wherein
the to-be-folded device is a display substrate, the main body portion comprises a mini/micro LED for display, and the to-be-folded portion comprises a driving circuit configured to drive the mini/micro LED to emit light.

* * * * *